Oct. 3, 1967 A. REISMAN ETAL 3,345,223

EPITAXIAL DEPOSITION OF SEMICONDUCTOR MATERIALS

Filed Sept. 28, 1965 6 Sheets-Sheet 1

INVENTORS
ARNOLD REISMAN
MELVIN BERKENBLIT
SATENIK A. PAPAZIAN
GEORGE CHEROFF

BY Thomas J. Kilgannon Jr.
ATTORNEY

EPITAXIAL DEPOSITION OF SEMICONDUCTOR MATERIALS

Filed Sept. 28, 1965 6 Sheets-Sheet 4

3,345,223

EPITAXIAL DEPOSITION OF SEMICONDUCTOR MATERIALS

Arnold Reisman and Melvin Berkenblit, Yorktown Heights, Satenik A. Papazian, New York, and George Cheroff, Peekskill, N.Y., assignors to International Business Machines Corporation, Armonk, N.Y., a corporation of New York Filed Sept. 28, 1965, Ser. No. 490,814
16 Claims. (Cl. 148—175)

This invention relates generally to a method for epitaxially depositing semiconductor material and more specifically to a method for vapor depositing germanium utilizing varying $H_2/(H_2+He)$ fractions introduced at the semiconductor source to provide a highly controllable deposition method which is relatively insensitive to temperature variation at both the semiconductor source and deposition regions.

The vapor deposition of semiconductive materials such as germanium utilizing disproportionation reactions is well known. All the known methods involve the use of a carrier gas, such as hydrogen, reacting with a halogen, such as iodine, to form hydrogen iodide. The mixture is then reacted with germanium at a temperature to preferentially form germanium di-iodide in the vapor phase. The germanium di-iodide is then introduced into a deposition region at a lower temperature where the germanium di-iodide disproportionates into germanium and germanium tetra-iodide. The germanium epitaxially deposits on an appropriate substrate while the tetra-iodide is removed from the system. This method wherein hydrogen is the sole carrier gas in the system is, however, relatively inefficient except at relatively high iodine pressures because of the large quantity of hydrogen iodide present. Further, while systems utilizing pure hydrogen are widely used, the operating conditions must be closely controlled to attain pick-up and deposition of germanium.

It is, therefore, an object of this invention to provide a method for epitaxially depositing germanium which is superior to prior art methods.

Another object is to provide a deposition method which is useful over a wide variation of the parameters involved.

Another object is to provide a method for epitaxially depositing germanium which is relatively insensitive to temperature variations at both the semiconductor source and deposition regions.

Still another object is to provide a method for epitaxially depositing germanium over a wide range of efficiencies.

Still another object is to provide a method for epitaxially depositing germanium which is highly controllable and reproducible.

Yet another object is to provide a method for epitaxially depositing germanium in which the composition of the carrier gases of the open tube disproportionation reaction is a major factor in determining the efficiency of such a system.

The foregoing and other objects, features and advantages of the invention will be apparent from the following more particular description of a preferred embodiment of the invention, as illustrated in the accompanying drawings.

Figure 1:
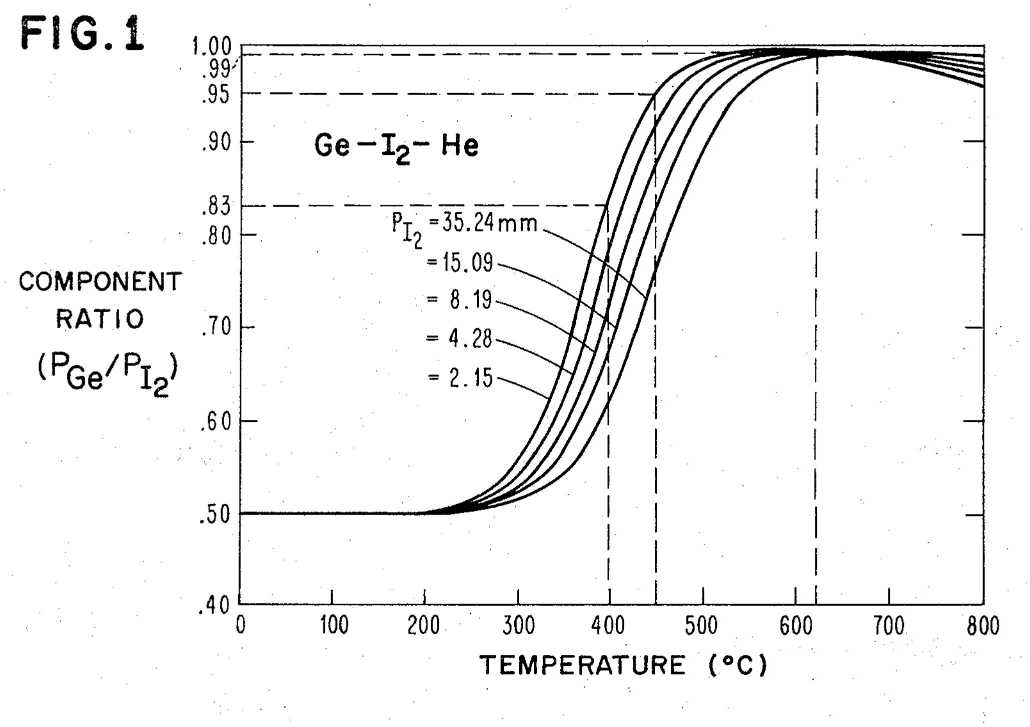
FIG. 1 is a plot of the component ratio $Ge/I_2$ versus temperature for a $Ge$-$I_2$-$He$ system at varying iodine source bed pressures.

In accordance with the invention the method taught herein utilizes the perturbation of a vapor phase disproportionation reaction at the semiconductor source to affect the ability of the basic reaction in providing semiconductor material in halide form in the vapor phase. In a disproportionation reaction, the amount of semiconductor material deposited from the vapor phase depends upon the amount of material picked-up from a semiconductor source. The amount picked-up in turn, depends upon such factors as the temperature and partial pressure of the material with which the semiconductor combines in the vapor phase. In a hydrogen, iodine, germanium system, for instance, the amount of germanium entering the vapor phase depends upon the partial pressure of iodine. In such a system germanium di-iodide ($GeI_2$) is formed at a relatively high temperature and disproportionation occurs at a lower temperature to deposit germanium on an appropriate substrate. As has been indicated, the system utilizing pure hydrogen is relatively inefficient and from a practical point of view is limited to use at high iodine vapor pressures. The present method by a dilution or perturbation technique, has extended the use of the open tube disproportionation system to encompass a wide variety of conditions. Thus, conditions of pick-up and deposition of semiconductor material, temperature, and partial pressure, can now be defined by the experimenter to achieve optimum results. This has been attained by the recognition that mixtures of hydrogen and inert gas or inert gas alone introduced at the germanium source and during the formation of a germanium halide provide variations in the efficiency of germanium pick-up and consequently in the efficiency of germanium deposition. Specifically, when different mole fractions of hydrogen and helium are provided at a given temperature at a germanium source along with a halogen or a halogen in halide form, it is possible to adjust the conditions of germanium pick-up and deposition so that maximum efficiency can be attained for the particular condition chosen. The mole fractions of hydrogen and helium, specifically the ratio $$F=\frac{H_2}{(H_2+He)}$$

encompasses the conditions where pure hydrogen, pure helium and all ratios between these conditions are utilized. Thus, $F=0$ in the instance where pure helium is utilized and $F=1$ in the instance where pure hydrogen is utilized. It was found unexpectedly that the utilization of the gas fractions to perturb the formation of the semiconductor halide had the added effect of providing a greater degree of temperature insensitivity at both the source and deposition regions. This means that close control of temperature at the source and deposition sites is no longer required and the resulting process is simplified.

The method of the present invention arose from a recognition that the lack of fundamental information has hindered the controlled optimized use of open tube systems for germanium transport by way of a disproportionation mechanism. To define conditions most suitable for iodine transport of germanium, the equilibrium conditions which arise when these elements, singly or together, are mixed with hydrogen or hydrogen iodide in the presence of hydrogen and/or inert gases were analyzed using computer techniques. The results of this analysis appeared in an article in The Journal of The Electrochemical Society, vol. 111, No. 10, October 1964, entitled "Thermodynamic Analysis of Open Tube Germanium Disproportionation Reactions" by A. Reisman and S. A. Alyanakyan.

The results of the analysis were a plurality of efficiency curves which showed the efficiency of various systems utilizing various hydrogen-helium fractions, $F$, and varying conditions of iodine partial pressure. Certain of these curves will be utilized hereinbelow to demonstrate the approach utilized and to show how experimental results conformed to those predicted by the computer technique.

Turning now to FIG. 1, there is shown a plot of the efficiency curves for a germanium, iodine, hydrogen system. The plot represents the variation of the compound ratio $Ge/I_2$ as a function of temperature. Each curve represents a different $He/I_2$ ratio and consequently each coincides with a different iodine source bed temperature. Experimentally, the treatment relates to a transport apparatus in which an inert gas, He, is transpired through an iodine source bed at a given temperature necessary to provide an equilibrium component pressure of iodine. The saturated gas, in which the sum of the component partial pressures equal one atmosphere, is then carried through a germanium source with which the iodine reacts and with which the resulting vapor phase species ($GeI_2$) equilibriate. Since the component $I_2$ is assumed to be confined to the vapor phase, the component ratio $He/I_2$ established at the iodine source remains constant thereafter. In the temperature interval shown in FIG. 1, 0–800° C., germanium deposition occurs primarily as a result of the disproportionation reaction.

$$2GeI_{2(v)} \rightleftarrows Ge_{(s)} + GeI_{4(v)}$$

Figure 2:
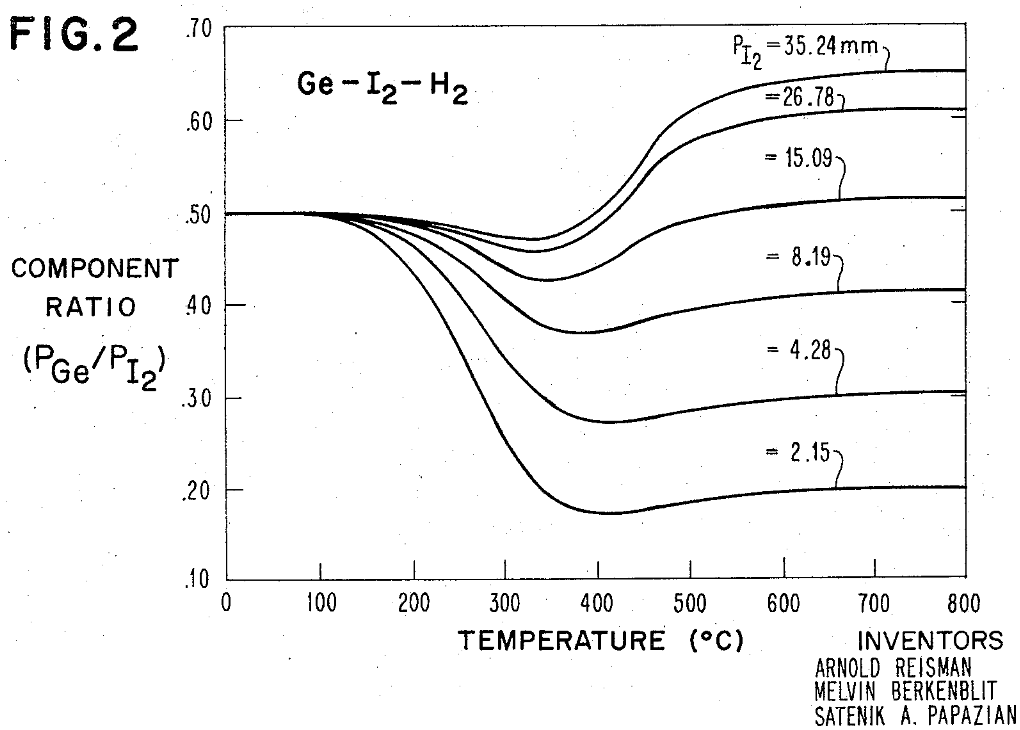
FIG. 2 is a plot of the component ratio $Ge/I_2$ versus temperature for a $Ge$-$I_2$-$H_2$ system at varying iodine source bed pressures.

Referring now to FIG. 2, there is shown a plot similar to that shown in FIG. 1 for the condition where the carrier gas (hydrogen) is also a reactive component. Experimentally, the physical system is the same as that defined in connection with FIG. 1. Chemically the system differs in that the reactive gas also functions as a carrier. As with FIG. 1, each curve represents a different $H_2/I_2$ ratio and each consequently represents a different iodine source bed temperature.

While it is not necessary for purposes of the inventor to explain in detail all the factors considered in generating the plots of FIG. 1 and FIG. 2, suffice it to say that a comparison of the two plots suggested the possibility of developing low temperature minima in useable seed site temperature intervals by employing mixtures of hydrogen and helium as carrier gases. In comparing FIGS. 1 and 2, it is noted that the minima in FIG. 2, for a given iodine source temperature lie at higher temperatures than the low-temperature plateaus of FIG. 1. The possibility then suggested itself that if the hydrogen carrier were diluted with helium, the competitive action of hydrogen for iodine would change causing the minima to shift to lower temperatures and become flatter in the process.

A germanium, iodine, hydrogen, helium system was proposed which physically conforms to one in which helium and hydrogen sources are used to provide a carrier mixture which is transpired through an iodine source supply where the setting of the iodine pressure fixes the ratio $H_2/I_2$.

Figure 4:
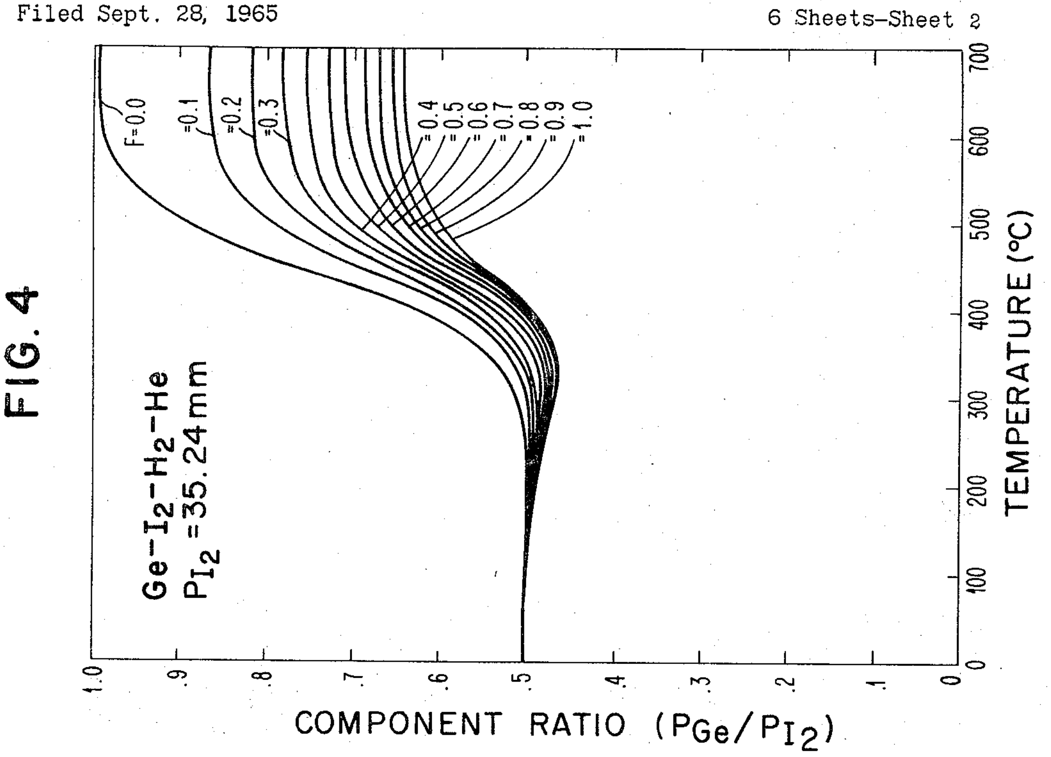
FIG. 4 is a plot of the component ratio $Ge/I_2$ versus temperature for a $Ge$-$I_2$-$H_2$-$He$ system at an iodine source bed pressure of 35.24 mm. and varying $H_2/(H_2+He)$ fractions.
Figure 3:
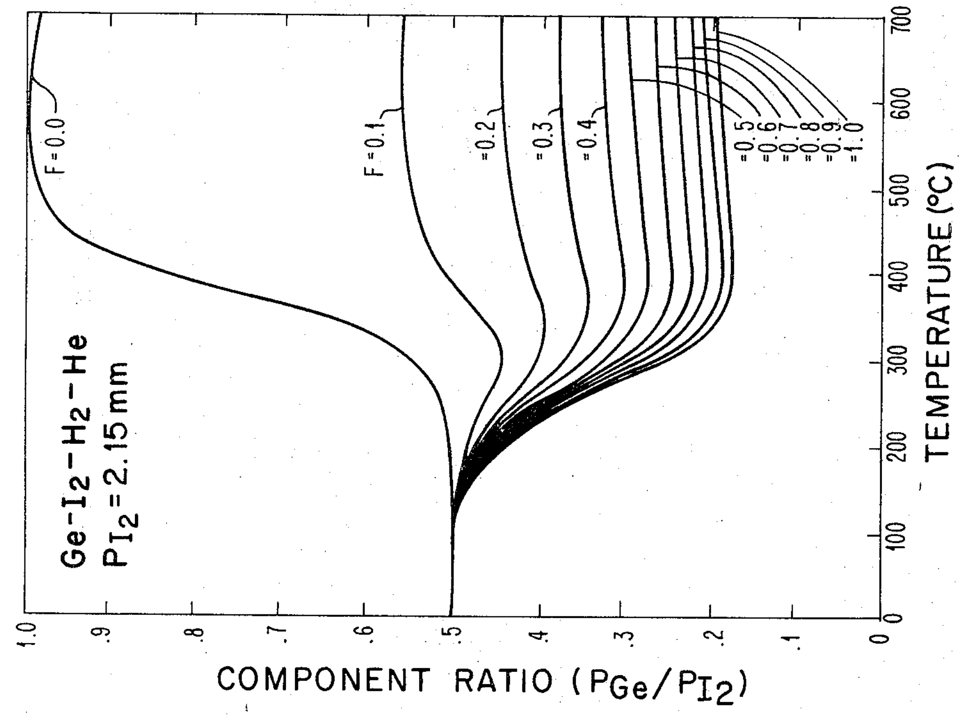
FIG. 3 is a plot of the component ratio $Ge/I_2$ versus temperature for a $Ge$-$I_2$-$H_2$-$He$ system at an iodine source bed pressure of 2.15 mm. and varying $H_2/(H_2+He)$ fractions.

FIGS. 3 and 4 show the variation of $Ge/I_2$ ratio with temperature for two families of curves, each family at a constant iodine pressure, and each curve of a family representing a different hydrogen-helium fraction. Each plot contains certain of the curves generated in connection with FIGS. 1 and 2 to provide a frame of reference in determining changing results. Thus, in FIG. 3, the $F=0$ or pure helium curve coincides with the $P_{I_2}=2.15$ mm. curve in FIG. 1 and the $F=1$ or pure hydrogen curve in FIG. 3 corresponds to the $P_{I_2}=2.15$ mm. curve in FIG. 2. There are also curves in FIG. 4 which correspond to the $P_{I_2}=35.24$ mm. curves in FIGS. 1 and 2.

Figure 6:
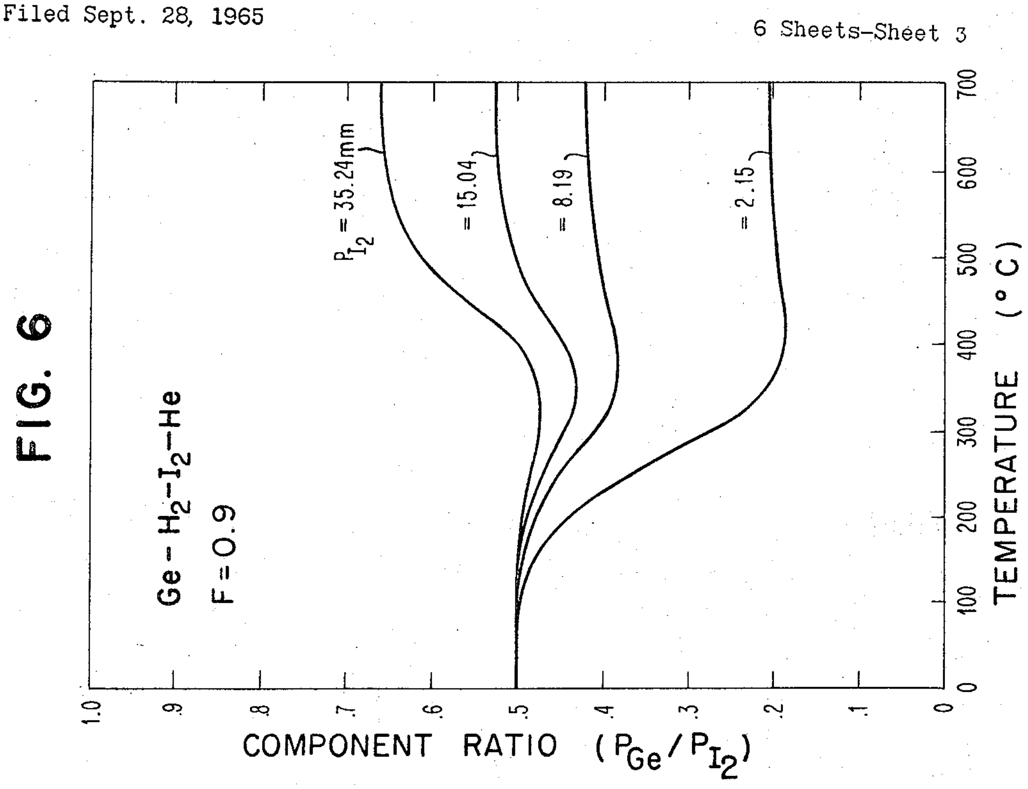
FIG. 6 is a plot of the component ratio $Ge/I_2$ versus temperature for a $Ge$-$I_2$-$H_2$-$He$ system at an $H_2/(H_2+He)$ fraction of 0.9 and varying iodine source bed pressures.
Figure 5:
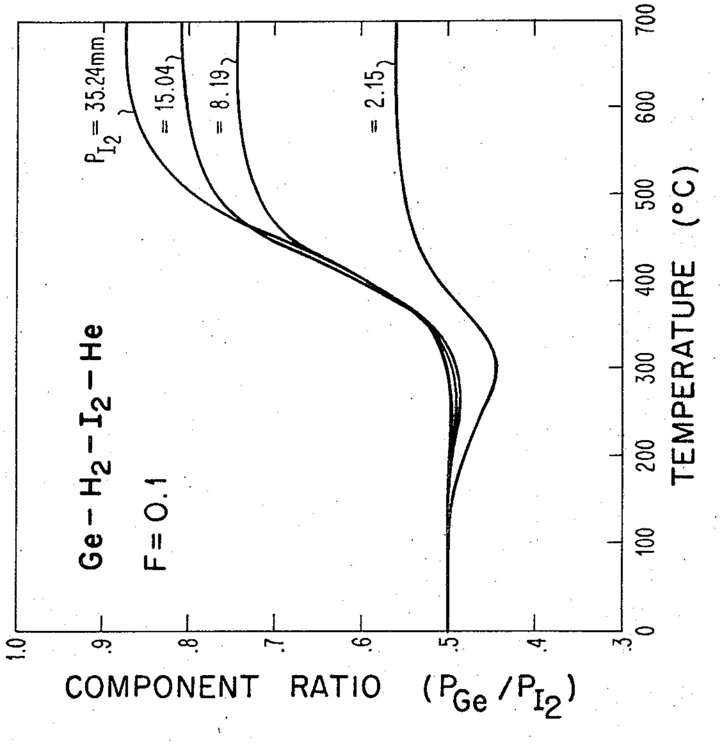
FIG. 5 is a plot of the component ratio of $Ge/I_2$ versus temperature for a $Ge$-$I_2$-$H_2$-$He$ system at an $H_2/(H_2+He)$ fraction of 0.1 and varying iodine source bed pressures.

FIGS. 5 and 6 present some of the data plotted using constant $H_2/(H_2+He)$ mole fractions, where the values of $Ge/I_2$ ratio are plotted as a function of temperature, each curve representing a different iodine source temperature.

As can be seen from FIGS. 3 and 4 when compared with the pure helium curve of FIG. 1, the perturbation of the pure He curves increase with increasing $H_2/(H_2+He)$ mole fractions; the higher $I_2$ source pressures being the most efficient and providing the least temperature sensitive seed site regions, coupled with high relative $Ge/I_2$ formation efficiency.

Figure 7:
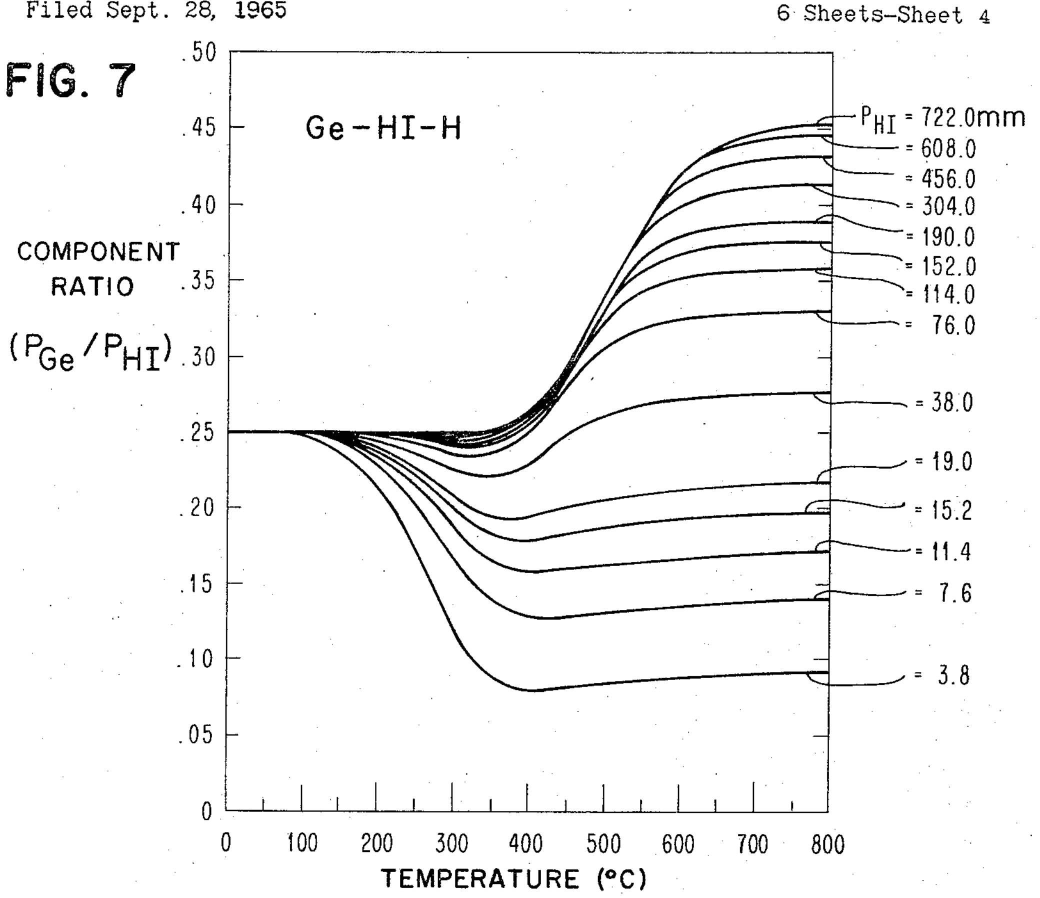
FIG. 7 is a plot of the component ratio Ge-HI versus temperature for a Ge-HI-H system at varying hydrogen iodine source pressures.

Referring now to FIG. 7, efficiency curves for a germanium, hydrogen iodide, hydrogen system are shown at varying hydrogen iodide source pressures over the temperature range 0–800° C. The system is thermodynamically equivalent to the system discussed in connection with FIG. 2 insofar as the same species are assumed present, and the equilibrium relationships employed are the same. A different choice of component stoichiometries are used however. It should be noted that the hydrogen species content cannot independently be brought to zero. In this system component counting is accomplished in terms of Ge, HI and H; a differentiation being made between hydrogen being derived from a tank source and from the halogen acid.

In the plot of FIG. 7, the data are presented in the form of Ge/HI ratios versus temperature. The Ge/HI value of 0.25 represents pure $GeI_4$ and the value of 0.5 represents pure $GeI_2$. The resulting curves show, as was shown by FIG. 2, that the efficiency of $GeI_2$ formation increases with increasing iodine pressure. In addition, at the highest HI pressures, the minima become low temperature plateaus with relative temperature insensitivity up to 400° C.

Figure 8:
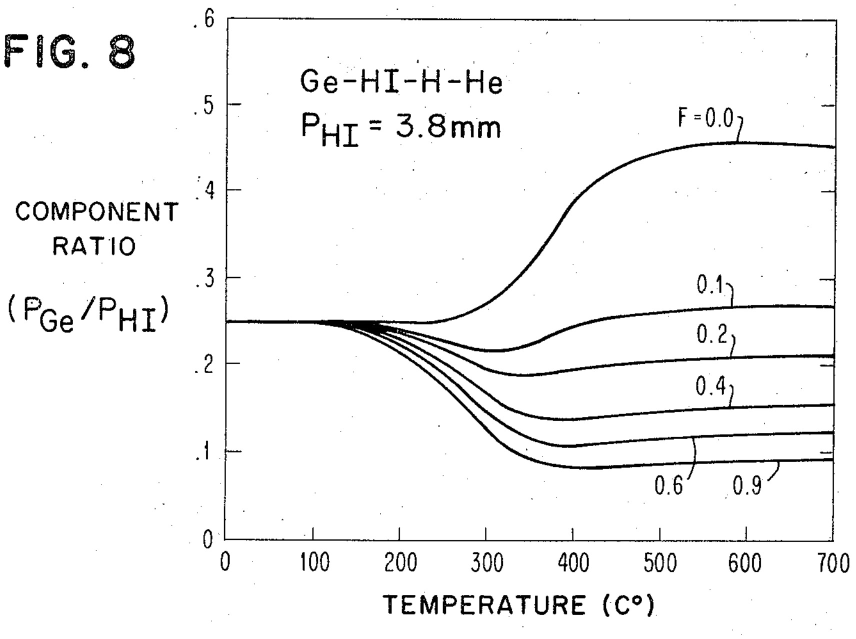
FIG. 8 is a plot of the component ratio Ge/HI for a Ge-HI-H-He system at an HI source pressure of 3.8 mm. and varying $H_2/(H_2+He)$ fractions.

FIG. 8 relates to a germanium, hydrogen iodide, hydrogen, helium system which is thermodynamically equivalent to the system discussed in connection with FIGS. 3 and 4. FIG. 8 shows a family of curves at constant HI mole fraction and varying hydrogen-helium mole fractions. An increase of HI pressure would provide other families of curves which show that as the hydrogen iodide values increase, the effect of varying $H_2/(H_2+He)$ mole fraction diminishes to the point where the curves for $F=0.1$ and 0.9 in FIG. 8 are practically coincident.

The curves of FIGS. 1 through 8 indicate that by increasing the mole fraction of hydrogen in helium in a disproportionation system the efficiency of both pick-up and deposition of germanium can be affected and that the efficiencies at a given F value can be enhanced by increasing the pressure of either iodine or hydrogen iodide. In addition, it was predicted that temperature insensitive source and deposition regions could be chosen for a deposition system by selecting appropriate iodine pressures and hydrogen-helium fractions.

The results predicted in the curves of FIGS. 1 through 8 were validated experimentally by a procedure involving transpiration phenomena in a Ge-He-$I_2$ system. The procedure involved a determination of flow conditions at different temperatures which were necessary for a helium stream to physically equilibriate with an iodine source, and for an $I_2$-He mixture to chemically and physically equilibriate with a germanium bed.

An iodine transpiration procedure was carried out, the results of which were substantially in agreement with similar values already present in the literature. A detailed explanation of the iodine transpiration procedure, although not required for an understanding of the present invention may be found in a paper entitled "Transpiration Studies of the Ge-$I_2$-Inert Gas System," by A. Reisman, M. Berkenblit and S. A. Alyanakyan, Journal of the Electrochemical Society, vol. 112, No. 2, February 1965.

By use of a transpiration procedure, values of the iodine vapor pressure in millimeters of Hg were calculated from experimentally determined values of iodine concentration in the vapor phase at two values of temperature. Table I shows the calculated values of $I_2$ pressure and the values obtained from the literature at two temperatures.

TABLE I

| Temp.° C. | Calculated Value $P_{I_2}$(mm.) | Literature Values [1] |
|---|---|---|
| 50.5 | 2.14±0.06 | 2.24 |
| 61.8 | 4.79±0.07 | 4.83 |

[1] G. P. Baxter, M. R. Grose, Journal American Chemical Society, 37, 1061 (1915).

The result of the iodine transpiration procedure was that at the temperatures considered, the iodine bed achieves equilibrium with the carrier gas at all flow rates up to approximately 0.9 liter/mm.

As a result of the thermodynamic analysis which resulted in data as shown in FIGS. 1 through 8, it was determined, in the temperature interval 350–650° C., that the vapor phase component mole ratio Ge/$I_2$ as a function of temperature is limited at the lower temperatures to a value of 0.5. The value coincides with the semiconductor halogen species stoichiometry $GeI_4$. At 650° C., the limiting value of the same ratio is 1.0. This value coincides with a semiconductor halogen species stoichiometry $GeI_2$. In view of this, it was expected that at temperatures within the range chosen, transpiration flow regions would provide values of the Ge/$I_2$ ratio within limits predicted by the thermodynamic analysis. The transpiration flow region for germanium can be evaluated by plotting germanium vapor phase concentration vs. flow rate. The amount of germanium in the vapor phase or removed from the source bed was determined by a weight loss method. In essence, an iodine-helium mixture was passed over a germanium source bed of crushed germanium at given velocities. The velocities were arbitrarily determined and were based on the hypothetical velocities that would have been obtained at flow rates through an unpacked germanium source bed of uniform inside diameter. Reasonably consistent data was obtained using this technique in conjunction with crushed germanium of arbitrary constant particle size distribution. The amount of germanium in the vapor phase was determined by measuring the difference in weight before and after a run at the temperature and the flow velocities chosen.

A detailed showing of the apparatus involved in the germanium transpiration study may be found in the article "Transpiration Studies of the Ge-$I_2$-Inert Gas System" by A. Reisman, M. Berkenblit and S. A. Alyanakyan and referred to hereinabove.

Figure 9:
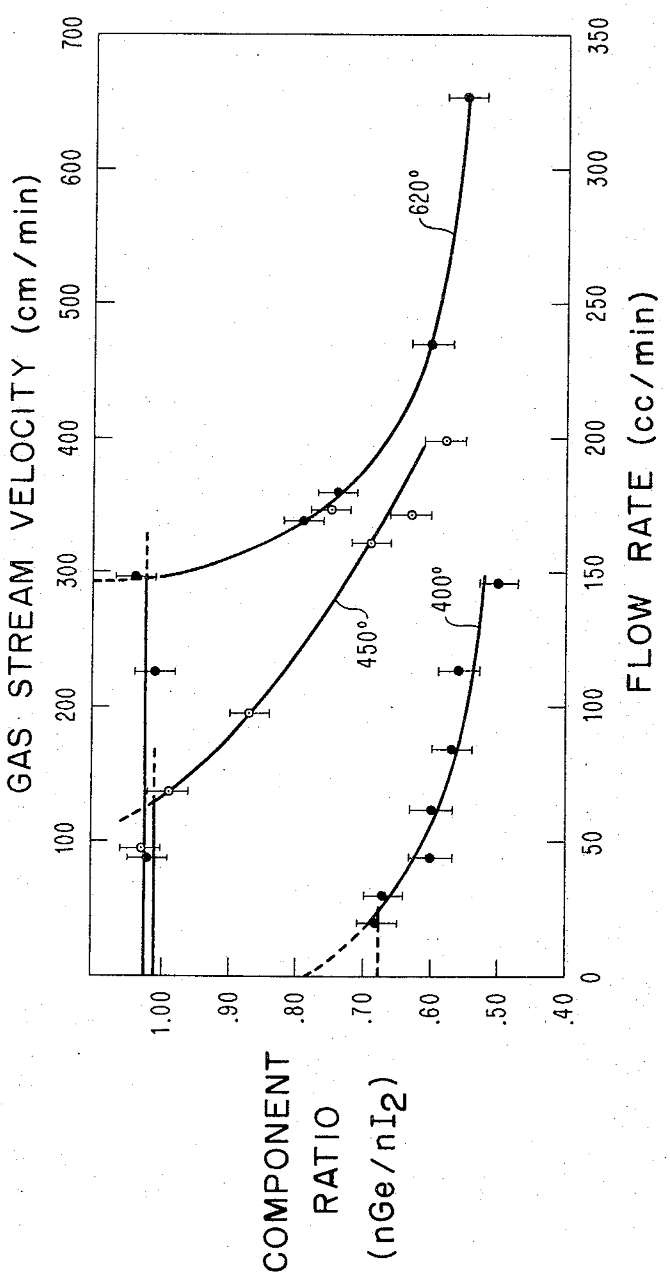
FIG. 9 is a plot of the component ratio $Ge/I_2$ versus flow rate and gas stream velocity at different temperature values for a $Ge$-$I_2$-$He$ system.

Referring now to FIG. 9, a plot of Ge/$I_2$ component mole ratios derived from the iodine and the transpiration study data is shown. The data was obtained using the following germanium bed dimensions.

Bed diameter (I.D.)=8 mm.
Cross sectional area=0.3 cm.$^2$
Length=7.5″

The data was taken at an iodine pressure of $P_{I_2}$=2.15 mm., one of the iodine pressures utilized in the iodine transpiration procedure and shown in Table I; at germanium bed temperatures of 400° C., 450° C. and at 620° C. and at a number of gas stream velocities as shown in FIG. 9. Knowing the iodine pressure and the velocities, the weight loss of germanium was determined by measuring the weight of the germanium source bed before and after transpiration. The data obtained and plotted in FIG. 9 indicated that there was close correlation between the predicted Ge/$I_2$ ratio and the ratio obtained experimentally.

Referring now to FIG. 9, the dotted portions of the 400° curve represent extrapolations to zero flow conditions in two ways. The lower dotted portion represents an assumption that transpiration has been achieved, while the upper dotted portion represents an assumption that transpiration is achieved only at zero flow. In the latter instance, the extrapolation intersects the zero flow axis at a Ge/$I_2$ equilibrium ratio of 0.78. This figure is in reasonable agreement with the value 0.83 which was predicted thermodynamically. This may be seen from FIG. 1, where, at a temperature of 400° C., the dotted line intersects the $P_{I_2}$=2.15 mm. curve at the 0.83 Ge/$I_2$ value. The 450° and 620° curves also provided values of Ge/$I_2$ ratio which are in reasonable agreement with predicted values. Thus, for the 450° C. temperature, an experimental value of 1.01±0.04 was obtained as against a predicted value of 0.95 and, for the 620° temperature, an experimental value of 1.03±0.03 was obtained as against the predicted value of 0.99. These results appear to fall within the limits of experimental uncertainty. The predicted values of Ge/$I_2$ ratio for the temperature of 450° C. and 620° C. are also indicated by dotted lines in FIG. 1.

In FIG. 9, it should be noted that all the curves generated appear to flatten out toward a limiting value of 0.5. This implies that the reaction of germanium with iodine proceeds via the following mechanism:

$$Ge_{(s)}+2I_{2(v)}\rightleftarrows GeI_{4(v)}$$

and $$GeI_{4(v)}+Ge\rightleftarrows 2GeI_{2(v)}$$

Since the latter mechanism is the one desired to accomplish the method of this invention, an experimental limitation is placed on the design of vapor growth systems if operation is attempted at high flow rates. This results from the fact that $GeI_4$ formation increases with increasing flow rate resulting in lower and lower transport efficiencies.

Figure 10:
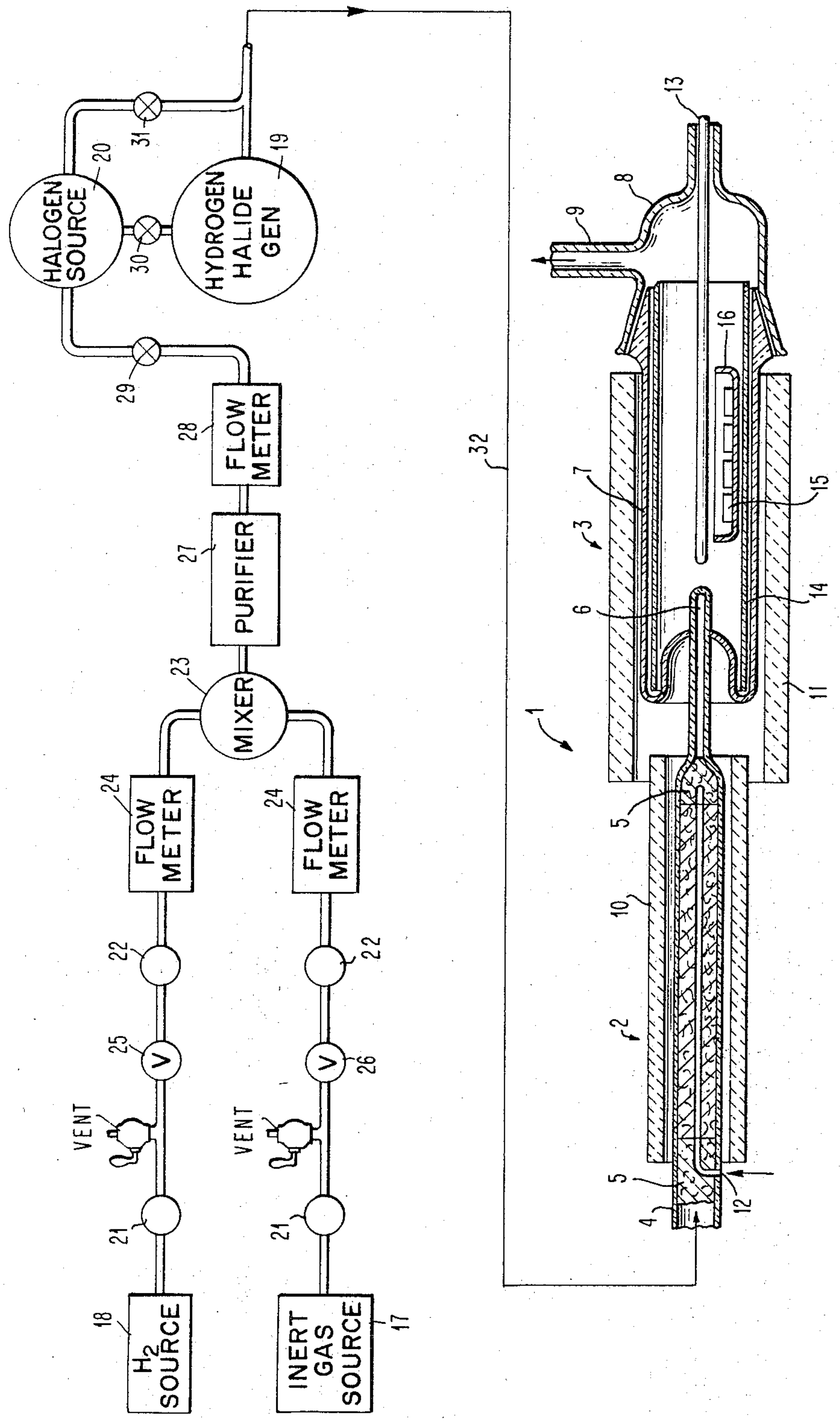
FIG. 10 is a partial block diagram cross-sectional view of apparatus utilized in performing the method of this invention.

Referring now to FIG. 10, there is shown a partial block-diagram cross-sectional view of apparatus utilized in the performance of this invention. An open tube disproportionation system is shown generally at 1 consisting of a germanium site or source bed 2 and a seed or deposition site 3. Germanium source bed 2 consists of pieces of crushed or pelletized germanium through which a desired gas or vapor may be passed. The crushed germanium is disposed in quartz tube 4 and retained therein by quartz wool plugs 5. Quartz tube 4, at the right hand end thereof terminates in a necked-down nozzle portion 6 which is receivable in quartz tube 7 which is an element comprising a portion of deposition site 3. Quartz tube 7 is closed by a removable section 8 which has an exhaust port 9 disposed therein for the removal of residual gases. Quartz tubes 4 and 7 are surrounded by furnaces 10, 11, respectively, which provide desired temperatures to source bed 2 and deposition site 3. The furnaces may be of any suitable type well known to those skilled in the deposition art. Thermocouple wells 12, 13 are shown disposed internally of quartz tubes 4 and 7, respectively. Wells 12, 13 are utilized to retain thermocouples (not shown) which monitor the required temperatures at a desired value. A liner tube 14 is shown in slidably engaging relationship with quartz tube 7. Liner tube 14 is utilized to facilitate the cleaning of the system and the removal and introduction of substrates 15 disposed in quartz boat 16 from quartz tube 7.

The gases utilized in the performance of the method of this invention are introduced into the left hand end of quartz tube 4 from an inert gas source 17, a hydrogen source 18, a hydrogen halide generator 19 and a halogen source 20. High and low pressure regulator 21, 22, respectively, inserted in the flow line control the flow of gas to mixer 23 and flow meters 24 monitor the flow from gas sources 17 and 18. Inert gas source 17 may be a source of any inert gas such as argon or nitrogen, but in the preferred method of this invention helium is utilized. On-off valves 25, 26, are utilized in instances where one or the other of the gases hydrogen and helium is used alone. The gas or gases, as the case may be, pass through mixer 23 to purifier 27 where contaminants are removed. Flow meter 28 monitors the resulting flow which may pass through either halogen source 20 alone or pass to hydrogen halide generator 19 by the appropriate operation of on-off valves 29, 30, 31. The flow from either hydrogen halide generator 19 or halogen source 20 is then carried to the disproportionation apparatus 1 by way of tabulation 32 shown schematically in FIG. 10.

From a consideration of the apparatus of FIG. 10 and FIGS. 1 through 8, it should be clear that it is possible to generate the gas combinations associated with the latter mentioned figures. In the instance where pure helium and iodine are required, the hydrogen source 18 and halide generator 19 are effectively removed from the system by closing on-off valves 25 and 30 respectively. In this arrangement, the iodine or other halogen introduced into apparatus 1 at a given temperature (600° C.) for instance, reacts with the germanium at source bed 2 to form a halide specie, $GeI_2$, for instance. After the reaction, the halide specie is transported to deposition site 3 where disproportionation at a lower temperature occurs resulting in the deposition of germanium on substrates 15. The remaining disproportionation product ($GeI_4$) is exhausted via exhaust port 9.

Mixtures of hydrogen and helium may also be introduced into apparatus 1 along with either a pure halide or with a hydrogen halide. The hydrogen halide form is preferable because it most easily satisfies the equilibrium conditions present at source bed 2 insuring the reaction of iodine and germanium stoichiometrically.

At germanium source bed 2, a mixture of hydrogen, helium and hydrogen iodide, for instance, is present having a total pressure of one atmosphere.

$$P\ \text{total}=760\ \text{mm.}=P_{HI}+P_{H_2}+P_{He}$$

At a source bed temperature of 600° C., for example, germanium di-iodide ($GeI_2$) is preferentially formed. The di-iodide is then carried to deposition site 3 where pure germanium is deposited on substrates 15. By changing the hydrogen-helium fraction F, it is possible to obtain a wide variety of conditions of both pick-up and deposition of germanium. In addition, the variation in the hydrogen-helium fraction or ratio provides a temperature insensitivity at the germanium source and deposition sites to such an extent that the necessity for precise temperature control at these sites is reduced. In open tube systems of this type, the amount of germanium deposited is proportional to the amount picked-up at source bed 2, so it should be clear that changing conditions at the source by the introduction of different hydrogen-helium fractions changes conditions at deposition site 3. The effect of adding more helium at source bed 2 is that conditions for the hydrogen halide remaining in the vapor phase are disturbed and as a result the greater the quantity of helium introduced, the more germanium halide, germanium di-iodide, for instance, is formed. The more germanium di-iodide formed, the more will be deposited on the substrates 15 when the germanium di-iodide disproportionates into pure germanium and germanium tetraiodide at a lower temperature than the source temperature. Where hydrogen is a constituent of the mixture, the partial pressure of hydrogen must at least be equal to the partial pressure of the halogen present.

In both the instances described hereinabove, an increase in the partial pressure of the halogen or hydrogen halide utilized enhances the pick-up and deposition of germanium and in a manner predicted by the curves of FIGS. 1 through 8. From this, it may be seen that in addition to the variation of the hydrogen-helium fraction, F, another parameter, iodine source pressure (which is a function of iodine temperature) may be varied to provide an additional variety of useful conditions at which germanium pick-up and deposition occurs.

It should be noted that an increase in iodine vapor pressure and hydrogen-helium fraction produces an overall increase in efficiency as well as providing the least temperature sensitive seed and deposition sites as predicted by FIGS. 3 and 4. Thus, the hydrogen-helium fraction F, may be varied from pure helium to substantially pure hydrogen and, increasing halogen pressures may be utilized to the point where further increases in halogen pressure provide no change in germanium deposition efficiencies.

Typical germanium source bed temperatures range from 550° C. to 900° C. and typical deposition site temperatures range from 300° C. to 400° C.

The halogens and the hydrogen halides are generated separately and introduced into apparatus 1 in vapor form. They may be produced by any suitable method well known to those skilled in the art. It should be appreciated that any of the halogens may be utilized to provide results similar to those obtained utilizing iodine. There is no reason to believe that any of the other halogens will not conform to the trends demonstrated using iodine. It is, of course, understood that equilibrium conditions at both the source and deposition regions will be somewhat different and such differences must be taken into account.

Table II contains data which demonstrates that by varying either the hydrogen-helium fraction or the halide partial pressure that the amount of germanium entering the vapor phase, and consequently the amount of germanium deposited, may be varied and also demonstrates that the temperature insensitivity referred to is attainable.

Flow rates in Table II are nominal values and are not critical in the practice of this method except, as pointed out in connection with FIG. 9. Very high flow rates should be avoided because transpiration does not occur in this region. The data of Table II was obtained utilizing the hydrogen-helium hydrogen iodide-germanium system described hereinabove in connection with FIG. 10. The method described hereinabove has been shown and described in abbreviated form, but not claimed, to demonstrate the methods used in the following co-pending applications which are assigned to the same assignee as the present invention.

"Method for Enhancing Efficiency of Recovery of Semiconductor Material in Perturbable Disproportionation System" in the names of A. Reisman, M. Berkenblit and S. A. Alyanakyan, and "Method of Doping Epitaxially grown Semiconductor Material" in the names of A. Reisman and M. Berkenblit.

TABLE II

| $F=\frac{H_2}{(H_2+He)}$ | $I_2$ Source Temp., ° C. | $I_2$ Vapor Pressure, mm. | Ge Source Bed Temp., ° C. | Flow Rate, cc./mm. | Ge in vapor phase per liter from HI source, mg./liter | Deposition Temp., ° C. | Ge Deposited, mg./liter |
|---|---|---|---|---|---|---|---|
| 0.2 | 50 | 2.15 | 600 | 75 | 3.4 | ------------ | ------------ |
| 0.2 | 60 | 4.29 | 600 | 75 | 8.4 | ------------ | ------------ |
| 0 | 50 | 2.15 | 600 | 75 | 7.8 | ------------ | ------------ |
| 0 | 50 | 2.15 | 600 | 75 | 7.8 | 350<br>300 | 2.7<br>3.5 |
| .2 | 50 | 2.15 | 600 | 75 | 3.4 | 350<br>300 | 0.3<br>0.2 |
| .2 | 60 | 4.29 | 600 | 75 | 8.4 | 350<br>300 | 1.6<br>1.6 |

While the invention has been particularly shown and described with reference to a preferred embodiment thereof, it will be understood by those skilled in the art that the foregoing and other changes in form and details may be made therein without departing from the spirit and scope of the invention.

What is claimed is:

1. A method for epitaxially depositing germanium by germanium halide transport which provides temperature insensitivity at a source and deposition site in an open tube disproportionation system comprising the steps of introducing a source of germanium into said tube, reacting one of the substances selected from the group consisting of the halogens and the hydrogen halides with said germanium and introducing an inert gas to perturb the equilibrium vapor phase content of germanium at said source.

2. A method according to claim 1 wherein the step of introducing an inert gas includes the step of introducing helium.

3. A method according to claim 1 further including the step of introducing hydrogen.

4. A method according to claim 3 further including the step of varying the amount of at least one of the gases hydrogen and helium introduced to control the amount of germanium produced in the vapor phase.

5. A method according to claim 1 further including the steps of providing a substrate at said deposition site and adjusting the temperature at said deposition site to cause a temperature controlled deposition of germanium on said substrate from the vapor phase.

6. A method according to claim 3 further including the step of varying the partial pressure of said halogens and said halides to control the amount of germanium produced in the vapor phase.

7. A method of epitaxially depositing germanium which provides temperature insensitivity at a source and deposition site comprising the steps of introducing germanium into said source, reacting a halogen with said germanium and introducing helium to control the reaction of said halogen with said germanium.

8. A method according to claim 7 wherein the step of reacting a halogen with said germanium includes the step of reacting a halide with said germanium.

9. A method according to claim 7 further including the step of introducing hydrogen.

10. A method according to claim 9 further including the step of varying the amount of at least one of the gases hydrogen and helium.

11. A method for epitaxially depositing germanium by a germanium halide vapor transport from a source to a deposition site which provides temperature insensitivity at said source and said deposition site comprising the step of providing at said source a hydrogen-inert gas fraction along with a germanium di-halide specie to control the efficiency of germanium deposition at a point remote from said source.

12. A method for epitaxially depositing germanium by hydrogen-hydrogen halide-inert gas-germanium vapor transport from a germanium source to a deposition site the steps of providing at said source a given hydrogen-inert gas fraction and varying the partial pressure of said hydrogen halide to control the amount of germanium produced in the vapor phase.

13. A method for epitaxially depositing germanium by hydrogen-hydrogen halide-inert gas-germanium vapor transport from a germanium source to a deposition site the steps of providing at said source a given partial pressure of said hydrogen halide and varying the hydrogen-inert gas fraction to control the amount of germanium produced in the vapor phase.

14. In the method for epitaxially depositing germanium by a germanium halide vapor transport from a germanium source to a deposition site the steps of introducing a substance at said source selected from the group consisting of the halogens and the hydrogen halides from a halogen source having a given partial pressure and introducing a given amount of a hydrogen-inert gas mixture at said source to control the amount of germanium produced in the vapor phase.

15. In the method according to claim 14 further including the step of varying the partial pressure of one of said substances selected from the group consisting of the halogen and the hydrogen halides.

16. In the method according to claim 14 further including the step of varying the amount of said hydrogen-inert gas mixture.

References Cited

UNITED STATES PATENTS

| | | | |
|---|---|---|---|
| 3,089,788 | 5/1963 | Marinace | 148—175 |
| 3,096,209 | 7/1963 | Ingham | 117—106 |
| 3,152,932 | 10/1964 | Matovich | 117—200 |
| 3,192,083 | 6/1965 | Sirtl | 148—174 |
| 3,224,912 | 12/1965 | Ruehrwein | 148—175 |

DAVID L. RECK, *Primary Examiner.*

N. F. MARKVA, *Assistant Examiner.*